(12) United States Patent
Heydari et al.

(10) Patent No.: US 11,287,331 B2
(45) Date of Patent: Mar. 29, 2022

(54) METHOD AND SYSTEM FOR SENSOR CONFIGURATION

(71) Applicants: Mahdi Heydari, Stanford, CA (US); Karthik Katingari, San Jose, CA (US)

(72) Inventors: Mahdi Heydari, Stanford, CA (US); Karthik Katingari, San Jose, CA (US)

(*) Notice: Subject to any disclaimer, the term of this patent is extended or adjusted under 35 U.S.C. 154(b) by 168 days.

(21) Appl. No.: 16/737,868

(22) Filed: Jan. 8, 2020

(65) Prior Publication Data

US 2020/0348189 A1 Nov. 5, 2020

Related U.S. Application Data

(63) Continuation-in-part of application No. 16/401,112, filed on May 1, 2019.

(51) Int. Cl.
*G01P 15/18* (2013.01)
*G01K 15/00* (2006.01)
*G01K 13/00* (2021.01)

(52) U.S. Cl.
CPC ........... *G01K 15/005* (2013.01); *G01K 13/00* (2013.01); *G01P 15/18* (2013.01)

(58) Field of Classification Search
CPC . G01P 15/0802; G01P 15/125; G01P 15/0831
USPC .......................................................... 73/497
See application file for complete search history.

(56) References Cited

U.S. PATENT DOCUMENTS

2010/0045362 A1* 2/2010 Dribinsky ............. G01P 15/008
327/513
2018/0128688 A1* 5/2018 Newell ..................... G01K 1/14

* cited by examiner

*Primary Examiner* — John Fitzgerald
*Assistant Examiner* — Rodney T Frank (57) ABSTRACT

Described herein are methods and systems for configuring sensors to compensate for a temperature gradient. Multiple sensor sets, each having at least two sensors of a same type with orthogonal axes, are positioned to form at least one opposing sensor pair, in which an axis of one sensor of one sensor set is in an opposite orientation to an axis of one sensor of another sensor set. A combined measurement of each opposing sensor pair may be output which is compensated for an effect of a temperature gradient on sensor measurements of the sensors.

25 Claims, 8 Drawing Sheets

METHOD AND SYSTEM FOR SENSOR CONFIGURATION

CROSS-REFERENCE TO RELATED APPLICATIONS

This application is a continuation-in-part of and claims priority to U.S. patent application Ser. No. 16/401,112, filed May 1, 2019, which is incorporated in full by reference.

FIELD OF THE PRESENT DISCLOSURE

This disclosure generally relates to motion sensors and more specifically to sensors configurations that compensate for the effect of temperature gradients across the sensors.

BACKGROUND

The development of microelectromechanical systems (MEMS) has enabled the incorporation of a wide variety of sensors into portable devices, such as cell phones, laptops, tablets, gaming devices and other portable, electronic devices. Although some embodiments are associated with a user, such portable devices may also include vehicles, such as drones, or other devices capable of relative motion. Notably, information from motion sensors such as gyroscopes that measure angular velocity and accelerometers that measure specific forces along one or more orthogonal axes may be used to determine the orientation, change in relative orientation and/or translational displacement of a device incorporating the sensors for use as a user input, to determine positional or navigational information for the device, or for other suitable purposes.

However, due to the nature of electronics and mechanics, sensors in general and MEMS sensors in particular are relatively sensitive to temperature and other environmental factors, which may affect the accuracy of the sensor readings. Correspondingly, sensors (e.g. accelerometers, gyroscopes, magnetometer, pressure sensors, etc.) can be compensated to reduce output signal changes that result from temperature effects. One strategy may be performed during production by measuring the output signal of each sensor at known temperatures, determining the temperature dependence of the output signals, and removing the effect of temperature variations by appropriate on chip or off-line signal processing. Conversely, other approaches involve employing a heating element to maintain a sensor at a temperature for which response characteristics are adequately known.

Although beneficial, none of these temperature compensation techniques address another aspect that influences sensor behavior, specifically the existence of a temperature gradient across the sensor. As used herein, temperature gradient refers to the change in temperature across a given dimension/direction of the sensor, thereby resulting in one part of the sensor having a different temperature than another part. As will be appreciated, a temperature gradient may result anytime a sensor is exposed to a non-uniform environment caused by one or more thermal elements, which can either cause local heating or cooling. Additionally, the thermal effect can be either intentional or unintentional. For example, a sensor that employs a dedicated heater or cooler to maintain the sensor at a known temperature still has the potential to impart a gradient. Conversely, a sensor may be located adjacent a component that generates varying amounts of heat depending on use, such as a processor, which correspondingly imparts a gradient.

Figure 1:
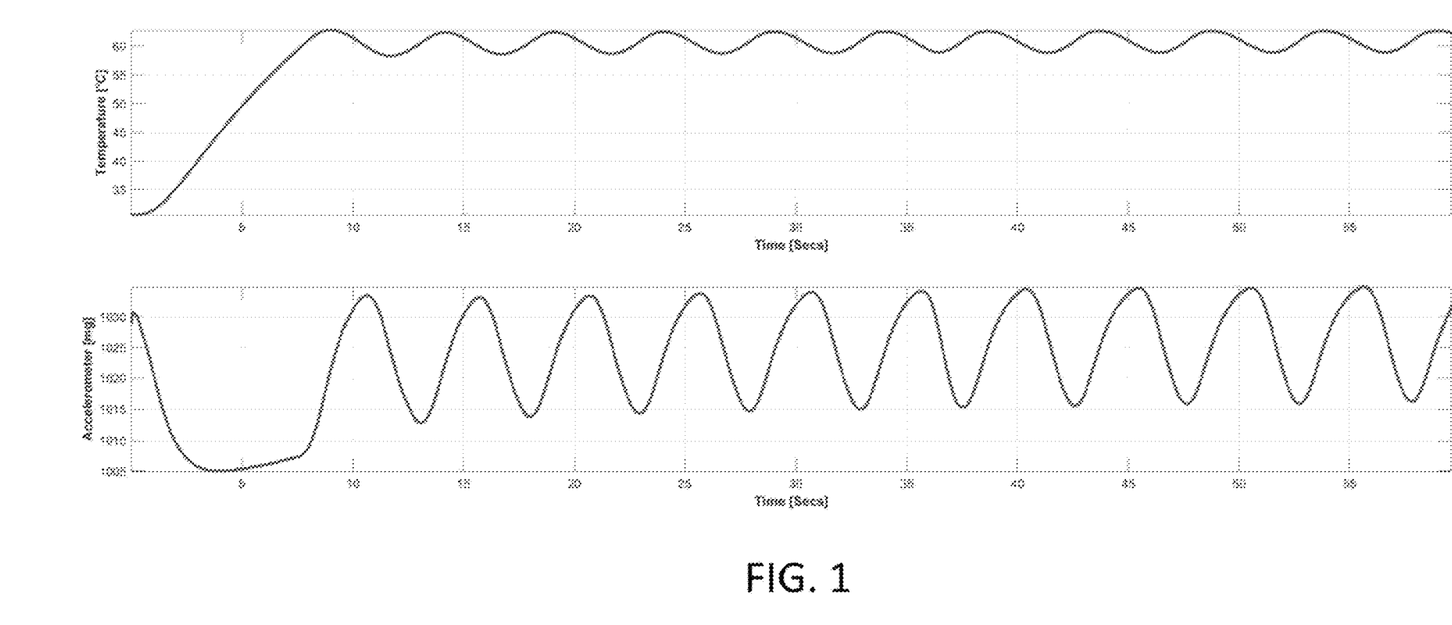
FIG. 1 is schematic diagram demonstrating effects of a thermal gradient on motion sensor measurements.

Moreover, sensor errors caused by a temperature gradient are generally even more challenging to model or estimate, at least in part because they are highly dependent on current environmental characteristics which cannot necessarily be adequately predicted. Furthermore, temperature gradients can be complex and can change quickly and depend on many (external) factors. To help illustrate, FIG. 1 schematically depicts a comparison of accelerometer temperature to its output measurements. In particular, the top graph shows the temperature of the sensor as controlled using a heating element subject to using conventional proportional integral derivative (PID) feedback. As shown, the temperature initially ramps up until the target temperature is achieved, with relatively small oscillations occurring subsequently as the heating element is selectively operated to maintain the target temperature. Although the temperature control keeps the sensor at a relatively constant temperature as shown, the heating element still causes a temperature gradient, the effects of which are shown in the bottom graph. Notably, even though the temperature variation is relatively minor, significant changes in the output measurements result. These fluctuations indicate errors in the output measurements, primarily in the form of offset or bias errors. In order to improve the accuracy of the accelerometer output, this effect of the temperature change/gradient should be corrected or compensated for. As discussed above, modeling such errors is difficult and renders attempts to correct the output measurements using a model equally difficult. This is evidenced by the behavior of the output during the first 10 seconds of the initial sensor heat up. In addition, properly characterizing the gradient would require accurate measurement of temperature at multiple locations on the sensor to determine the gradient. Even if the expense and complexity of employing additional temperature sensors were undertaken, such an approach would also require the inefficient and time-consuming process of establishing the output signal response at multiple possible gradient amplitudes as well as at different temperatures.

Correspondingly, there is a need for a practical solution to improve sensor performance by reducing the errors associated with the existence of a thermal gradient. The techniques of this disclosure as described in the following materials satisfies this and other needs.

SUMMARY

As will be described in detail below, this disclosure includes a method for configuring sensors sets to compensate for a temperature gradient. The method may include providing a first sensor set, having at least two sensors of a same type that have axes orthogonal with respect to each other and providing a second sensor set, having at least two sensors of the same type that have axes orthogonal with respect to each other. The first and second sensor sets may then be positioned with respect to each other to form at least one opposing sensor pair, in which an axis of one sensor of one sensor set is in an opposite orientation to an axis of one sensor of another sensor set. Correspondingly, a combined measurement of each opposing sensor pair may be output, wherein each combined measurement is compensated for an effect of a temperature gradient on sensor measurements of the sensors.

The techniques of this disclosure also involve a sensor configuration to compensate for a temperature gradient featuring a first sensor set, having at least two sensors of a same type that have axes orthogonal with respect to each other and a second sensor set, having at least two sensors of the same type that have axes orthogonal with respect to each other. The first and second sensor sets may be positioned with respect to each other to form at least one opposing sensor pair, in which an axis of one sensor of one sensor set is in an opposite orientation to an axis of one sensor of another sensor set and wherein the sensor configuration is operable to output a combined measurement of each opposing sensor pair, wherein each combined measurement is compensated for an effect of a temperature gradient on sensor measurements of the sensors.

Still further, this disclosure also includes a sensor set to compensate for a temperature gradient, comprising a first sensor set, having at least one sensor having an axis, and a packaging that allows direct and inverted mounting, wherein mounting one sensor set with direct mounting and one sensor set with inverted mounting forms at least one opposing sensor pair, in which the axis of the at least one sensor of one sensor set is in an opposite orientation to the axis of the at least one sensor of the other sensor set so that measurements from both sensor sets are combinable to compensate for an effect of a temperature gradient on sensor measurements of the sensors.

DETAILED DESCRIPTION

At the outset, it is to be understood that this disclosure is not limited to particularly exemplified materials, architectures, routines, methods or structures as such may vary. Thus, although a number of such options, similar or equivalent to those described herein, can be used in the practice or embodiments of this disclosure, the preferred materials and methods are described herein.

It is also to be understood that the terminology used herein is for the purpose of describing particular embodiments of this disclosure only and is not intended to be limiting.

The detailed description set forth below in connection with the appended drawings is intended as a description of exemplary embodiments of the present disclosure and is not intended to represent the only exemplary embodiments in which the present disclosure can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the specification. It will be apparent to those skilled in the art that the exemplary embodiments of the specification may be practiced without these specific details. In some instances, well known structures and devices are shown in block diagram form in order to avoid obscuring the novelty of the exemplary embodiments presented herein.

For purposes of convenience and clarity only, directional terms, such as top, bottom, left, right, up, down, over, above, below, beneath, rear, back, and front, may be used with respect to the accompanying drawings or chip embodiments. These and similar directional terms should not be construed to limit the scope of the disclosure in any manner.

In this specification and in the claims, it will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements present.

Some portions of the detailed descriptions which follow are presented in terms of procedures, logic blocks, processing and other symbolic representations of operations on data bits within a computer memory. These descriptions and representations are the means used by those skilled in the data processing arts to most effectively convey the substance of their work to others skilled in the art. In the present application, a procedure, logic block, process, or the like, is conceived to be a self-consistent sequence of steps or instructions leading to a desired result. The steps are those requiring physical manipulations of physical quantities. Usually, although not necessarily, these quantities take the form of electrical or magnetic signals capable of being stored, transferred, combined, compared, and otherwise manipulated in a computer system.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present application, discussions utilizing the terms such as "accessing," "receiving," "sending," "using," "selecting," "determining," "normalizing," "multiplying," "averaging," "monitoring," "comparing," "applying," "updating," "measuring," "deriving" or the like, refer to the actions and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments described herein may be discussed in the general context of processor-executable instructions residing on some form of non-transitory processor-readable medium, such as program modules, executed by one or more computers or other devices. Generally, program modules include routines, programs, objects, components, data structures, etc., that perform particular tasks or implement particular abstract data types. The functionality of the program modules may be combined or distributed as desired in various embodiments.

In the figures, a single block may be described as performing a function or functions; however, in actual practice, the function or functions performed by that block may be performed in a single component or across multiple components, and/or may be performed using hardware, using software, or using a combination of hardware and software. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure. Also, the exemplary wireless communications devices may include components other than those shown, including well-known components such as a processor, memory and the like.

The techniques described herein may be implemented in hardware, software, firmware, or any combination thereof, unless specifically described as being implemented in a specific manner. Any features described as modules or components may also be implemented together in an integrated logic device or separately as discrete but interoperable logic devices. If implemented in software, the techniques may be realized at least in part by a non-transitory processor-readable storage medium comprising instructions that, when executed, performs one or more of the methods described above. The non-transitory processor-readable data storage medium may form part of a computer program product, which may include packaging materials.

The non-transitory processor-readable storage medium may comprise random access memory (RAM) such as synchronous dynamic random access memory (SDRAM), read only memory (ROM), non-volatile random access memory (NVRAM), electrically erasable programmable read-only memory (EEPROM), FLASH memory, other known storage media, and the like. The techniques additionally, or alternatively, may be realized at least in part by a processor-readable communication medium that carries or communicates code in the form of instructions or data structures and that can be accessed, read, and/or executed by a computer or other processor. For example, a carrier wave may be employed to carry computer-readable electronic data such as those used in transmitting and receiving electronic mail or in accessing a network such as the Internet or a local area network (LAN). Of course, many modifications may be made to this configuration without departing from the scope or spirit of the claimed subject matter.

The various illustrative logical blocks, modules, circuits and instructions described in connection with the embodiments disclosed herein may be executed by one or more processors, such as one or more motion processing units (MPUs), digital signal processors (DSPs), general purpose microprocessors, application specific integrated circuits (ASICs), application specific instruction set processors (ASIPs), field programmable gate arrays (FPGAs), or other equivalent integrated or discrete logic circuitry. The term "processor," as used herein may refer to any of the foregoing structure or any other structure suitable for implementation of the techniques described herein. In addition, in some aspects, the functionality described herein may be provided within dedicated software modules or hardware modules configured as described herein. Also, the techniques could be fully implemented in one or more circuits or logic elements. A general purpose processor may be a microprocessor, but in the alternative, the processor may be any conventional processor, controller, microcontroller, or state machine. A processor may also be implemented as a combination of computing devices, e.g., a combination of an MPU and a microprocessor, a plurality of microprocessors, one or more microprocessors in conjunction with an MPU core, or any other such configuration.

Unless defined otherwise, all technical and scientific terms used herein have the same meaning as commonly understood by one having ordinary skill in the art to which the disclosure pertains.

Finally, as used in this specification and the appended claims, the singular forms "a, "an" and "the" include plural referents unless the content clearly dictates otherwise.

As noted above, the techniques of this disclosure relate to motion sensor configurations that reduce or otherwise mitigate errors associated with a temperature gradient existing across the sensor. For example, the sensor configuration may employ a pair of the same type sensors having opposing orientations with respect to a thermal element, such as may be caused by a heating or cooling source. One notable application of such an opposing motion sensor pair configuration is in the context of a portable device that can be moved in space by a user and its motion and/or orientation in space therefore sensed. Details regarding one embodiment of portable device 200 including features of this disclosure are depicted as high level schematic blocks in FIG. 2. Common examples include a mobile phone (e.g., cellular phone, a phone running on a local network, or any other telephone handset), wired telephone (e.g., a phone attached by a wire), personal digital assistant (PDA), video game player, video game controller, navigation device, activity or fitness tracker device (e.g., bracelet or clip), smart watch, other wearable device, mobile internet device (MID), personal navigation device (PND), digital still camera, digital video camera, binoculars, telephoto lens, portable music, video, or media player, remote control, or other handheld device, or a combination of one or more of these devices. However, the techniques of this disclosure are not limited to portable devices and the described opposing sensor pair configurations may be used in any context where sensor operation may be affected by the existence of a temperature gradient and where this effect may negatively impact the (desired) accuracy.

Figure 2:
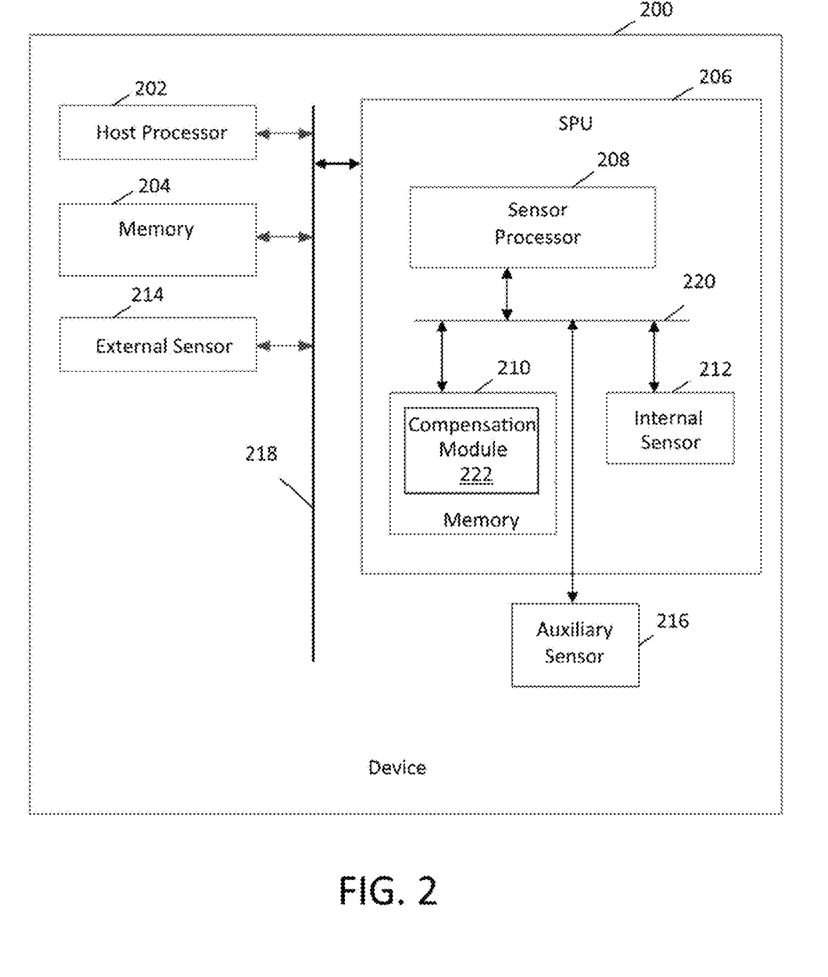
FIG. 2 is a schematic diagram of portable device having a sensor configuration that includes an opposing sensor pair to compensate for temperature gradient errors according to an embodiment.

As shown, device 200 includes a host processor 202, which may be one or more microprocessors, central processing units (CPUs), or other processors to run software programs, which may be stored in memory 204, associated with the functions of device 200. Multiple layers of software can be provided in memory 204, which may be any combination of computer readable medium such as electronic memory or other storage medium such as hard disk, optical disk, etc., for use with the host processor 202. For example, an operating system layer can be provided for device 200 to control and manage system resources in real time, enable functions of application software and other layers, and interface application programs with other software and functions of device 200. Similarly, different software application programs such as menu navigation software, games, camera function control, navigation software, communications software, such as telephony or wireless local area network (WLAN) software, or any of a wide variety of other software and functional interfaces can be provided. In some embodiments, multiple different applications can be provided on a single device 200, and in some of those embodiments, multiple applications can run simultaneously.

Device 200 includes at least one sensor assembly, as shown here in the form of integrated sensor processing unit (SPU) 206 featuring sensor processor 208, memory 210 and internal sensor configuration 212, which may have at least one opposing pair of sensors according to the techniques of this disclosure. Depending on the embodiment, the opposing pair of sensors may be implemented within SPU 206 or each sensor of the opposing pair may be in separate SPUs for example. Memory 210 may store algorithms, routines or other instructions for processing data output by internal sensor configuration 212 and/or other sensors as described below using logic or controllers of sensor processor 208, as well as storing raw data and/or motion data output by internal sensor configuration 212 or other sensors. Memory 210 may also be used for any of the functions associated with memory 204. Internal sensor configuration 212 may be one or more sensors for measuring motion of device 200 in space, such as an accelerometer, a gyroscope, a magnetometer, a pressure sensor or others. Depending on the configuration, SPU 206 measures one or more axes of rotation and/or one or more axes of acceleration of the device. In one embodiment, internal sensor configuration 212 may include rotational motion sensors or linear motion sensors. For example, the rotational motion sensors may be gyroscopes to measure angular velocity along one or more orthogonal axes and the linear motion sensors may be accelerometers to measure linear acceleration along one or more orthogonal axes. Sensors of the same type measure equivalent aspects of motion, albeit with the same or different sensitive axes and/or the same or different orientation regarding a sensitive axis. In one aspect, three gyroscopes and three accelerometers may be employed, such that a sensor fusion operation performed by sensor processor 208, or other processing resources of device 200, combines data from internal sensor configuration 212 to provide a six axis determination of motion or six degrees of freedom (6DOF). Further, as will be discussed in further detail below, the effects of a temperature gradient may be relatively greater for one axis of a sensor as compared to the other two orthogonal axes (for a three axes device). Correspondingly, the opposing sensor pair configuration may involve only one axis of measurement or may involve multiple axes of measurement, in which one pair of measurement axes are in opposition. As desired, internal sensor configuration 212 may be implemented using Micro Electro Mechanical System (MEMS) to be integrated with SPU 206 in a single package. Exemplary details regarding suitable configurations of host processor 202 and SPU 206 may be found in, commonly owned U.S. Pat. No. 8,250,921, issued Aug. 28, 2012, and U.S. Pat. No. 8,952,832, issued Feb. 10, 2015, which are hereby incorporated by reference in their entirety. Suitable implementations for SPU 206 in device 200 are available from InvenSense, Inc. of San Jose, Calif.

Alternatively, or in addition, device 200 may implement an opposing sensor pair in the form of external sensor configuration 214. This is optional and not required in all embodiments. External sensor configuration 214 may represent one or more sensors as described above, such as an accelerometer and/or a gyroscope. As used herein, "external" means a sensor that is not integrated with SPU 206 and may be remote or local to device 200. Also alternatively or in addition, SPU 206 may receive data from an auxiliary sensor configuration 216 configured to measure one or more aspects about the environment surrounding device 200, and which may also include an opposing sensor pair as desired. This is optional and not required in all embodiments. For example, a pressure sensor and/or a magnetometer may be used to refine motion determinations made using internal sensor configuration 212. In one embodiment, auxiliary sensor configuration 216 may include a magnetometer measuring along three orthogonal axes and output data to be fused with the gyroscope and accelerometer inertial sensor data to provide a nine axis determination of motion. In another embodiment, auxiliary sensor configuration 216 may also include a pressure sensor to provide an altitude determination that may be fused with the other sensor data to provide a ten axis determination of motion. Although described in the context of one or more sensors being MEMS based, the techniques of this disclosure may be applied to any sensor design or implementation. Depending on the embodiment, any combination sensors of internal sensor configuration 212, external sensor configuration 214 and/or auxiliary sensor configuration 216 may employ an opposing sensor pair according to the techniques of this disclosure with any remainder employing conventional single sensor configurations. Moreover, as desired, the sensors of an opposing pair may be implemented using different combinations of internal sensor configuration 212, external sensor configuration 214 and/or auxiliary sensor configuration 216. For example, one sensor of an opposing pair may be in internal sensor configuration 212 and the other may be in either external sensor configuration 214 or auxiliary sensor configuration 216. Likewise, one sensor for the opposing pair may be in external sensor configuration 214 and the other in auxiliary sensor configuration 216.

In the embodiment shown, host processor 202, memory 204, SPU 206 and other components of device 200 may be coupled through bus 218, while sensor processor 208, memory 210, internal sensor configuration 212 and/or auxiliary sensor configuration 216 may be coupled though bus 220, either of which may be any suitable bus or interface, such as a peripheral component interconnect express (PCIe) bus, a universal serial bus (USB), a universal asynchronous receiver/transmitter (UART) serial bus, a suitable advanced microcontroller bus architecture (AMBA) interface, an Inter-Integrated Circuit (I2C) bus, a serial digital input output (SDIO) bus, a serial peripheral interface (SPI) or other equivalent. Depending on the architecture, different bus configurations may be employed as desired. For example, additional buses may be used to couple the various components of device 200, such as by using a dedicated bus between host processor 202 and memory 204.

Code, algorithms, routines or other instructions for processing sensor data may be employed by compensation module 222, schematically represented in this figure as being stored in memory 210 for execution by sensor processor 208, to perform any of the operations associated with the techniques of this disclosure. As will be discussed in further detail below, the opposing sensor pair configurations of this disclosure can compensate for the existence of a temperature gradient across the sensor by combining the measurements from the opposing sensors. Correspondingly, compensation module 222 may be configured to perform this combination of measurements, which may include in some embodiments selectively weighting the measurements as warranted by the architecture or design of the sensor configuration. Compensation module 222 may combine measurements from opposing pairs of sensors from any of internal sensor configuration 212, external sensor configuration 214 and/or auxiliary sensor configuration 216. For example, when one sensor of the opposing pair is implemented in internal sensor configuration 212 and the other in external sensor configuration 214 or auxiliary sensor configuration 216, calibration module 212 may receive the measurements output by the other sensor to perform the combination. As desired, compensation module 222 or another aspect of SPU 206 may control the other sensor in a master/slave configuration. As noted, the combination of measurements may be with regard to one or more axes of measurement. Alternatively, or in addition, the functionality of compensation module 222 may be implemented using host processor 202 and memory 204 or any other suitable processing resources. In this case, SPU 206 may transfer the sensor data acquired to host processor 202 and/or memory 204.

Any combination of sensor components of device 200 may be formed on different chips or may be integrated and reside on the same chip, creating a unitary package. A chip may be defined to include at least one substrate typically formed from a semiconductor material. A single chip or package may be formed from multiple substrates, where the substrates are mechanically bonded to preserve the functionality. A multiple chip includes at least two substrates, wherein the two substrates are electrically connected, but do not require mechanical bonding. A package provides electrical connection between the bond pads on the chip to a metal lead that can be soldered to a PCB. A package typically comprises a substrate and a cover. Integrated Circuit (IC) substrate may refer to a silicon substrate with electrical circuits, typically CMOS circuits. One or more sensors may be incorporated into the package if desired using any suitable technique. In some embodiments, a sensor may be MEMS-based, such that a MEMS cap provides mechanical support for the MEMS structure. The MEMS structural layer is attached to the MEMS cap. The MEMS cap is also referred to as handle substrate or handle wafer. In some embodiments, the first substrate may be vertically stacked, attached and electrically connected to the second substrate in a single semiconductor chip, while in other embodiments, the first substrate may be disposed laterally and electrically connected to the second substrate in a single semiconductor package. In one embodiment, the first substrate is attached to the second substrate through wafer bonding, as described in commonly owned U.S. Pat. No. 7,104,129, which is incorporated herein by reference in its entirety, to simultaneously provide electrical connections and hermetically seal the MEMS devices. This fabrication technique advantageously enables technology that allows for the design and manufacture of high performance, multi-axis, inertial sensors in a very small and economical package. Integration at the wafer-level minimizes parasitic capacitances, allowing for improved signal-to-noise relative to a discrete solution. Such integration at the wafer-level also enables the incorporation of a rich feature set which minimizes the need for external amplification.

Figure 3:
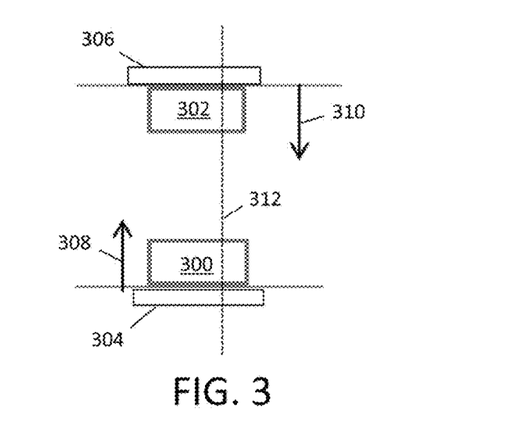
FIG. 3 is schematic diagram of an opposing sensor pair configuration having dedicated thermal elements according to an embodiment.

One suitable architecture of an opposing sensor pair configuration of this disclosure is schematically depicted in FIG. 3. In this embodiment, a first sensor 300 and a second sensor 302 are of the same type and are temperature controlled by thermal elements 304 and 306, respectively. For example, thermal elements 304 and 306 may be on-chip heaters but as noted above, cooling elements may also be used. As shown, thermal element 304 imparts temperature gradient 308 in first sensor 300, while thermal element 306 imparts temperature gradient 310 in second sensor 302. Thus, temperature gradients 308 and 310 are in opposite directions with regard to axis 312 and correspondingly, first sensor 300 and second sensor 302 have opposing orientations with respect to axis 312, forming an opposing sensor pair as termed herein. Likewise, a coinciding sensor pair refers to two sensors having a common axis of measurement aligned in the same orientation. As will be detailed below, the concepts of this disclosure can readily be extended to a plurality of orthogonal axes. Typically, a set of sensors may be of the same type and employed to provide measurements along one or more sensitive axes. For the sake of illustration and without limitation, a sensor set may refer to a first sensor aligned with the x-axis, a second sensor aligned with the y-axis and a third sensor aligned with the z-axis. Although different coordinate systems may be employed with different terminologies, it will be appreciated that a sensor set having sensors aligned along three orthogonal axes can measure motion with three degrees of freedom (DOF), representing any direction of motion in three-dimensional space. In other embodiments, a sensor set may employ fewer sensors with a corresponding loss in measurement dimension. Notably, a sensor set with two sensors aligned orthogonally captures motion with two DOF, while a sensor set having only one sensor measures one DOF. Different sensor sets are employed according to the techniques of this disclosure to form one or more opposing sensor pairs. Although discussed in the context of motion sensors, the techniques of this disclosure are also applicable to any other type of suitable sensor as desired. In the context of FIG. 3, first sensor 300 represents one sensor set and second sensor 302 represents a second sensor set, such that together first sensor 300 and second sensor 302 form an opposing sensor pair. As will be discussed in further detail below, sensor sets having sensors aligned along two or more orthogonal axes can be positioned with respect to each other to form a plurality of opposing sensor pairs as desired. For example, two sensor sets can be oriented with respect to each other to form two opposing sensor pairs. Further, if the sensor sets each include three orthogonal axes, one pair of sensors have axes of measurement that have the same orientation rather than being in opposition, forming a coinciding sensor pair according to the terminology of this disclosure. Likewise, three sensor sets can be positioned with respect to each other to form the two different opposing sensor pairs along with one coinciding sensor pair for each of the three axes of three-dimensional space.

The sensor architecture is selected such that the effect of the temperature gradient on the sensor measurements should be the inverse for at least one of the opposing sensor pairs. In other words, the effect of the temperature gradient on the measurements of the first sensor should be the inverse of the effect of the temperature gradient on the measurements of the second sensor. As such, architectures similar to FIG. 3 may be employed whenever a temperature-controlled motion sensor is implemented, such as in drone or robotic applications. In this embodiment and others that employ temperature-controlled sensors, it may be desirable to regulate operation of the thermal elements to improve performance of the sensors, including by achieving a more effective compensation of the thermal gradient. For example, thermal elements 304 and 306 may be regulated based on feedback from first sensor 300 and/or second sensor 302.

For the sake of the following discussion, first sensor 300 and second sensor 302 are accelerometers but in other embodiments, different types of motion sensors may be used, such as gyroscopes or others, although the techniques may also be extended to non-motion sensors as well. Further, axis 312 corresponds to the z-axis of first sensor 300 and second sensor 302. As such, first sensor 300 and second sensor 302 may have only this single axis of measurement or they may feature other axes of measurement, which are typically orthogonal. Notably, the construction of sensors 300 and 302 and their implementation in device 200 may result in one axis being more sensitive to temperature gradient effects. As such, any axis that is common to both may be used with respect to the opposing sensor pair. For example, one representative MEMS architecture has two in-plane measurement axes, which may correspond to the x- and y-axes, and an out-of-plane measurement axis, which may correspond to the z-axis. For the embodiment shown in FIG. 3, the impact of a temperature gradient may be relatively greater for the out-of-plane measurement axis, so the depicted configuration places sensors 300 and 302 in opposing orientations with respect to their z-axis. Further embodiments are discussed below with regard to configurations that also involve forming opposing sensor pairs in one or both of the in-plane measurement axes.

As mentioned above, the effect of the temperature gradient on the first sensor should be the opposite of the effect of the temperature gradient on the second sensor. In the example configuration of FIG. 3, the accelerometer sensors measure gravity (assuming there is no motion). This means that the temperature gradient effect on the measurement of the gravity acceleration for the first sensor should be the opposite to that of the second sensor. In this case the gravity acceleration is in a downward direction, meaning it is in the same direction as temperature gradient 310, while it is in the opposite direction as temperature gradient 308 (as required). For first sensor 302 the temperature gradient effect may decrease the measured acceleration, while for sensor 300 the temperature gradient effect may increase the measured acceleration. Therefore, due to their opposing orientations, first sensor 300 nominally outputs measurements $A_z$ that include gravity g as well as temperature gradient error f(tg) as indicated in Equation (1);

$$A_z(\text{Sensor}_1) = g - f(tg) \quad (1)$$

Similarly, second sensor 302 outputs measurements as indicated in Equation (2), with the inverse value for gravity due to the opposing orientation:

$$A_z(\text{Sensor}_2) = -g - f(tg) \quad (2)$$

In one embodiment, compensation module 222 may be configured to combine the measurements from first sensor 300 and second sensor 302 by averaging the measurements from both sensors, using the inverse of one to account for the opposing orientation according to Equation (3):

$$A_z(\text{Sensor}_C) = (A_z(\text{Sensor}_1) + (-1)(A_z(\text{Sensor}_2)))/2 \quad (3)$$

Equation (3) may be readily simplified by substituting Equations (1) and (2) as indicated in Equation (4):

$$A_z(\text{Sensor}_C) = (g - f(tg) + (-1)(-g - f(tg))/2 = g \quad (4)$$

As will be appreciated, the errors associated with the temperature gradient cancel each other due to the opposing orientations of first sensor 300 and second sensor 302 and the reversed effect of the temperature gradient. In general, the sensor architecture is designed so that the temperature gradients affect the sensors measurements of both sensors in opposite ways, and as a result the effect of the temperature gradient can be removed/minimized by the appropriate combination of the sensor measurements. The temperature gradient may affect the sensor by influencing, for example, the mechanical, structure or electronic operation of the sensor. In MEMS sensors, the temperature gradient may, e.g. through deformation, affect springs structures, resonator structures, bending structures, membranes, and similar structures that may change characteristics depending on the temperature. Although, the example above explains the principle of the invention using an accelerometer, similar effects may occur in other types of motion sensors, such as e.g. gyroscope, and non-motion sensors, such as e.g. pressure sensors, microphones etc. Therefore, the proposed solution may be applied for any type of sensor where temperature gradients cause the effects on the sensor measurements as discussed herein. According to Equation (4), the cancellation of the temperature gradient errors represents the ideal condition in which each sensor experiences the same temperature gradient and is affected in the same way. Accordingly, it may be desirable to employ sensors that are similar to each other or otherwise exhibit equivalent performance, such as by employing the same materials, constructions and/or techniques. As one example, each sensor may be taken from the same manufacturing lot. Similarly, it may be desirable to employ thermal elements 304 and 306 that have equivalent characteristics and are associated with each sensor in the same manner. However, to the extent differences exist between first sensor 300 and second sensor 302, thermal elements 304 and 306, and/or their relative associations with each other, it may be desirable to perform suitable calibration operations to characterize the response of each sensor. In such embodiments, compensation module 222 may then combine the output measurements using a selective weighting or a proportion rather than a straight average. The calibration procedure may determine the weights, for example, by minimize noise or variance in the sensor signal, and this may be performed during (controlled) motion procedures and/or (controlled) temperature variations. The calibration may be done in the factory, may be performed by the user, or may be done opportunistically during the use of the device whenever appropriate conditions are detected, such as e.g. periods or non or low motion. When thermal elements are used to control the temperature of the sensor(s), the speed of changing the temperature may be adapted depending on the quality of the compensation. Slow varying temperatures may be easier to correctly compensate than fast changing temperatures. Therefore, the speed of temperature change may be limited based on the quality of the compensation, to avoid conditions where the quality of the compensation degrades because the temperature changes too fast.

Figure 4:
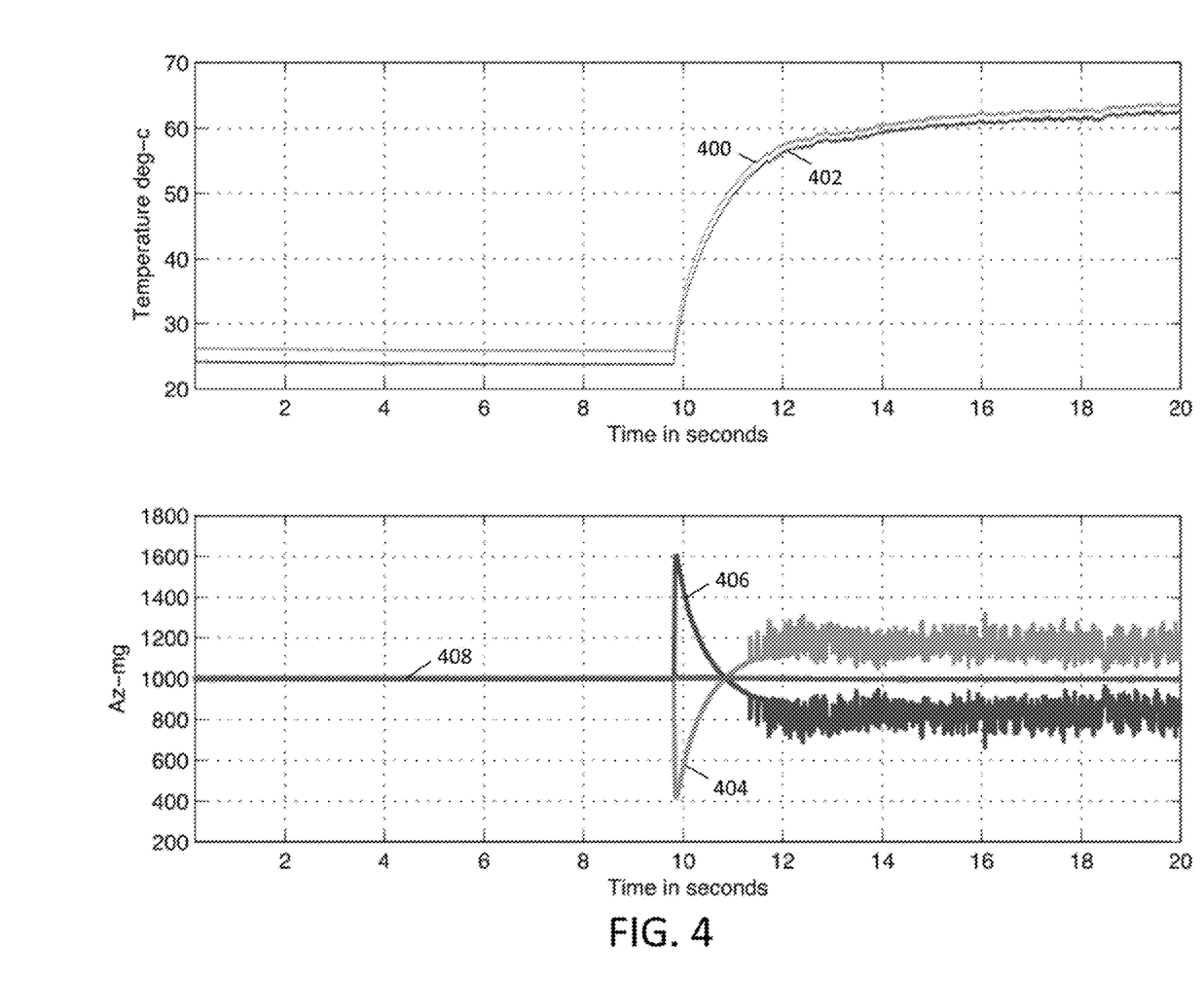
FIG. 4 is schematic diagram showing the combination of measurements from an opposing sensor pair according to an embodiment.

As an example of the advantages enabled through the techniques of this disclosure, FIG. 4 schematically depicts the performance of an opposing sensor pair. In particular, the top graph shows the temperature of a first sensor, represented as trace 400, and a second sensor, represented as trace 402, as they are heated from ambient temperature to a predefined working temperature. Over the interval shown, a baseline is provided for approximately the first ten seconds at ambient temperature, after which the thermal elements (on-chip heaters) are activated to bring the sensors to a working temperature of approximately 60° C. Correspondingly, the bottom graph shows the measurements output by each sensor individually, with trace 404 representing the first sensor and trace 406 representing the second sensor, as well as the combined measurement, represented by trace 408. As shown, the sensors' performance is nominal before heating since no or substantially no temperature gradient exists, but then each individual sensor experiences a significant perturbation in the output measurement when the thermal elements are first activated. The temperature gradient is greatest at the beginning of the heating process and attenuates as the sensors are brought up to their working temperature. The noise present in the curves for the individual sensor is associated with switching the thermal element as shown with respect to FIG. 1. These aspects are reflected in the perturbations of the output measurements which are also greatest at the beginning of the heating process and likewise attenuate. Notably, even though it is reduced, a temperature gradient still exists after the temperature has stabilized at the working temperature due to the difference with respect to ambient. Importantly, even though the first and second sensors output measurements with the indicated perturbations, their combined measurement has substantially no perturbation due to the cancellation of the respective temperature gradient errors.

Figure 5:
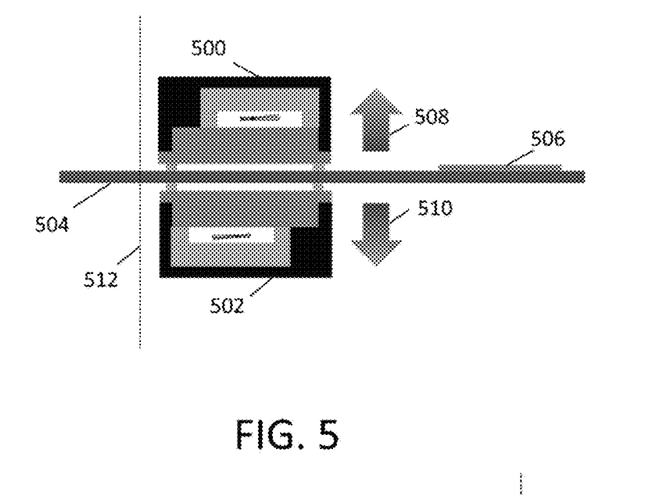
FIG. 5 is schematic diagram of an opposing sensor pair configuration positioned with respect to a thermal element according to an embodiment.

Another suitable opposing sensor pair architecture is schematically depicted in FIG. 5. Here, a first sensor 500 and a second sensor 502 are of the same type and are mounted on opposing surfaces of a substrate, such as e.g. a printed circuit board (PCB) 504. Another component mounted on the PCB, such as a processor, acts as a thermal element 506 that creates temperature gradient 508 in first sensor 500 and temperature gradient 510 in second sensor 502. As with the other embodiments of this disclosure, temperature gradients 508 and 510 are in opposite directions with regard to axis 512 and first sensor 500 and second sensor 502 have opposing orientations with respect to axis 512. Accordingly, an embodiment similar to FIG. 5 may be used to compensate for temperature gradient effects in applications where a heat source or other thermal element is positioned relatively close to the sensors. Typical examples include any processing unit or other component that generates heat non-uniformly as found in portable devices such as those described above, dedicated devices used for Internet of Things (IoT) applications, industrial and/or computationally-intense modules, and the like. Combination of measurements from sensors 500 and 502 may be similar to that described above, as the opposing orientations of the sensors provides the same effective cancellation of temperature gradient errors. Should the temperature gradient not be perfectly similar due to the fact that the heating element is positioned only on one side of the substrate, different weights can be used in the combining of the sensor signals, as discussed above. In some embodiments, the design of the system may be such that it enables good thermal conduction that results in a near perfect symmetric temperature gradient. This may be accomplishing through choice of materials and/or layout.

Figure 6:
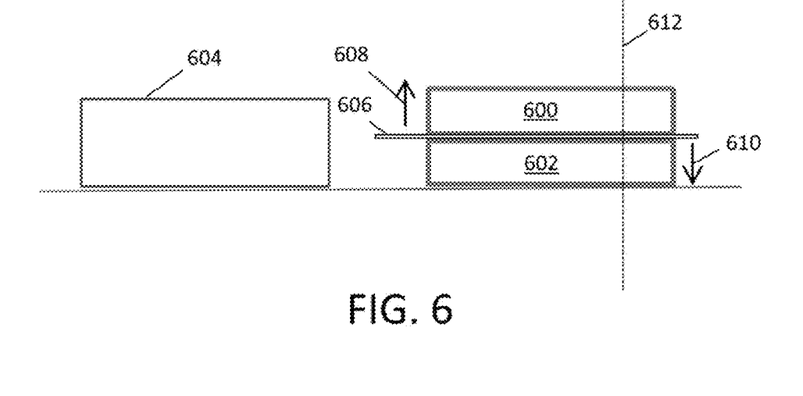
FIG. 6 is schematic diagram of an opposing sensor pair configuration having a thermal conduit according to an embodiment.

Yet another suitable opposing sensor pair architecture is schematically depicted in FIG. 6, with first sensor 600 and second sensor 602 stacked in opposing orientations. A thermal element 604, which again may be a processor or other variable source of heat, is located adjacent the sensors. A thermal conduit 606, e.g. "heat pipe" or the like, is positioned between the sensors and is coupled to thermal element 604 or otherwise configured to conduct heat such as by being positioned in sufficient proximity to thermal element 604. Correspondingly, thermal conduit 606 is configured to help establish substantially equivalent temperature gradients in the sensors, with temperature gradient 608 imparted in first sensor 600 and temperature gradient 610 imparted in second sensor 602. Thermal conduit 606 may be connected to or associated with the substrate and/or the heat source to ensure resulting equivalent, but opposing, temperature gradients. Once more, temperature gradients 608 and 610 are in opposite directions with regard to axis 612 and first sensor 600 and second sensor 602 likewise have opposing orientations with respect to axis 612. Also similarly, the measurements from sensors 600 and 602 may be combined in any suitable manner as described above.

Figure 7:
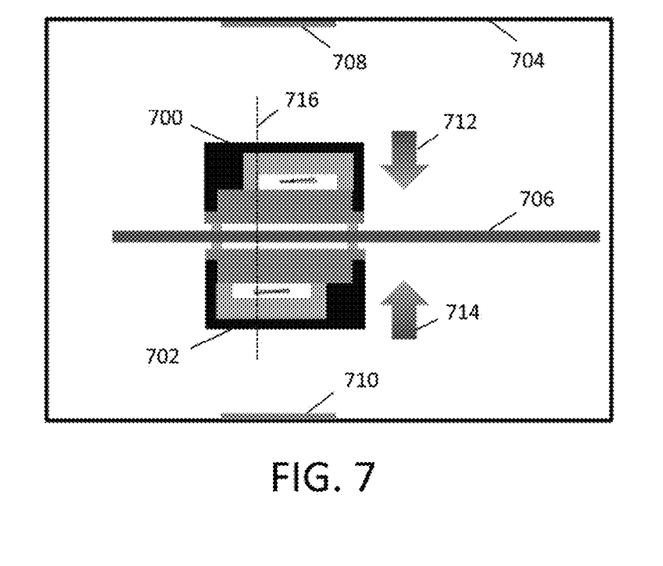
FIG. 7 is schematic diagram of an opposing sensor pair configuration having dedicated thermal elements within a housing according to an embodiment.

A further exemplary architecture is schematically depicted in FIG. 7, with first sensor 700 and second sensor 702 contained within a housing 704, that may be insulated as desired. Sensors 700 and 702 are mounted on opposing sides of substrate 706, which depending on the embodiment, may be insulated or configured to exchange heat with the exterior of housing 704. Dedicated thermal elements 708 and 710 are substantially symmetrically located with respect to each respective sensor. As such, temperature gradient 708 is imparted in first sensor 700 and temperature gradient 710 is imparted in second sensor 702. In the depicted embodiment, thermal elements 708 and 710 are configured as heating elements, so the temperature gradients are the reverse of those in the embodiments of FIGS. 4 and 5. However, it will be appreciated that the alternative use of cooling elements would cause a switch in the gradient direction. Regardless, the respective temperature gradients are in opposition to each other to allow for the effective cancellation of the resulting errors when output measurements from both sensors are combined, according to the disclosure above.

The different sensor architectures described and discussed are mere example embodiments. Any sensor configuration that results in similar but opposing temperature gradients may be used in order for the current invention to be applied and compensate for the effect of the temperature gradients on the sensor signals. Furthermore, these principles may be applied to any sensor were the temperature gradient causes an additional sensor signal or disturbance to the sensor signal, that can be averaged out as described above. Although the examples show the use of two sensors, more sensors may be used if needed, or if it further improves the cancelation of temperature gradient effects.

Indeed, although the above discussion is in the context of a temperature gradient that exists in a single direction, it may be appreciated that gradients may exist in a plurality of directions, such as any or all three axes of a sensor assembly. Typically, a predominant temperature gradient may exist, such that the axis of one opposing pair of sensors may be positioned to be aligned with the predominant temperature gradient in order to obtain the benefits noted above, such as a temperature gradient caused by at least one thermal element. Indeed, by aligning the opposing pair of sensors with the axis of the temperature gradient, opposing thermal gradients may be generated in each sensor so that the effect is at least partially canceled, such as by positioning the respective sensors of the aligned opposing sensor pair symmetrically with respect to the thermal element. However, when greater precision and avoidance of temperature-influenced perturbations is desired, the techniques of this disclosure may involve sensor configurations that provide additional opposing pairs of sensors with respect to a plurality of axes, such as two or three orthogonal axes.

Figure 8:
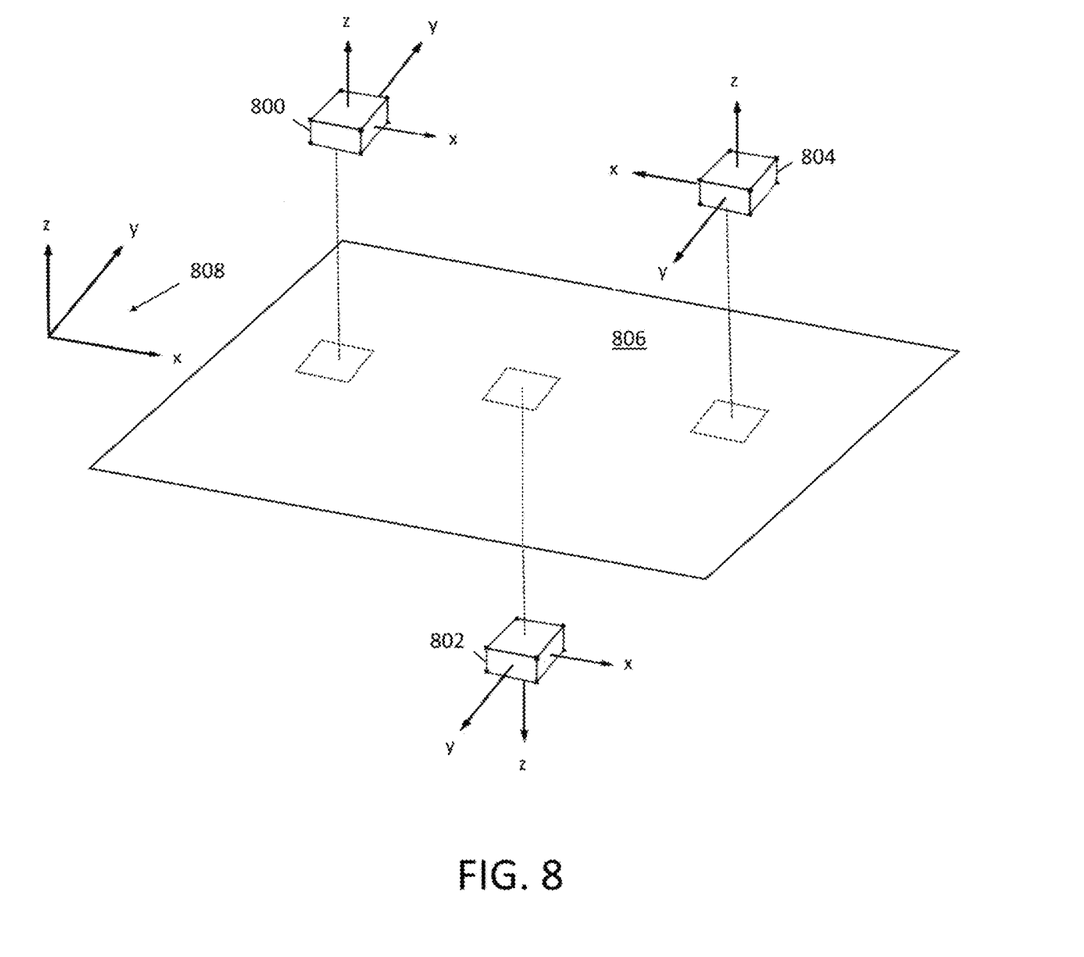
FIG. 8 is schematic diagram of three sensor sets positioned with respect to each other to form opposing sensor pairs along multiple axes according to an embodiment.

To help illustrate these further aspects of this disclosure, FIG. 8 schematically depicts a configuration with first sensor set 800, second sensor set 802 and third sensor set 804. Each sensor set includes three sensors of the same type having the indicated orientations along x-, y- and z-axes. As an illustration only, each sensor set can be implemented as a separate chip and mounted to a printed circuit board (PCB) 806 in the orientations shown. For example, each sensor set could be implemented as a sensor assembly 206 as discussed above. Notably, in addition to the set of sensors of the same type (e.g., accelerometers), the sensor assembly can also include sensors of other types, such as another set of sensors (e.g., gyroscopes) and/or individual sensors. However, it should be appreciated that many suitable architectures are possible and different packaging techniques may be employed as desired, including fabricating a single chip having up to nine sensors of the same type having the indicated orientations of sensitive axes. In the context of the embodiment shown in FIG. 8, sensor sets 800 and 802 have opposing sensor pairs for the z-axis and the y-axis, with a coinciding sensor pair for the x-axis. In turn, sensor sets 800 and 804 have opposing sensor pairs for the x-axis and the y-axis, with a coinciding sensor pair for the z-axis while sensor sets 800 and 804 have opposing sensor pairs for the z-axis and the x-axis, with a coinciding sensor pair for the y-axis.

Correspondingly, techniques similar to those described above may be used to output combined measurements from two or more of sensor sets 800, 802 and 804 that are based on one or more opposing sensor pairs. Combining the measurements may include outputting the measurements in a suitable frame of reference for the device, such as coordinate system 808. For example, Equations (1)-(4) above represent averaging the sum of a sensor measurement of one sensor of an opposing sensor pair and an inverted sensor measurement of the other sensor of the opposing sensor pair. Equations (1)-(4) are expressed in the context of the z-axis and thus could be directly applied to the opposing sensor pairs for the z-axis, but can also be readily adapted for the opposing sensor pairs for the x- and/or y-axes. By using an appropriate opposing sensor pair, the measurements from sensor sets 800, 802 and 804 can therefore be combined to compensate for temperature gradients occurring along each of the three axes. Likewise, in addition to straight averaging, the measurements from one or more of the opposing sensor pairs may be combined using any desired selective weighting to account for a lack of uniformity in the temperature gradient experienced by the respective sensors. As noted above, such weighting can be based on a calibration procedure or in any other suitable manner.

Further, other types of measurement combination can be employed when more than two sensor sets exist. For example, in the configuration of as sensor sets 800, 802 and 804 shown in FIG. 8, two different opposing sensor pairs are formed for each axis. As such, the averages of each opposing sensor pair can in turn be combined, either as a straight average or weighted as desired. Additionally, the presence of coinciding sensor pairs also allows for the combination of measurements from each sensor of the pair, but without inversion given that their orientation coincides rather than opposes. Exemplary illustrations are represented by Equations (5), (6) and (7) for each of the three axes with respect to coordinate system 808 and correspond to averaging a sum of an inverted sensor measurement of one sensor of an opposing sensor pair and an average of a sensor measurement of the other sensor of the opposing sensor pair and a sensor measurement from a sensor of another of the sensor sets having a coinciding orientation.

$$A_x^{com} = ((A_x^{800} + A_x^{802})/2 - A_x^{804})/2 \quad (5)$$

$$A_y^{com} = ((A_y^{800} - (A_y^{802} + A_y^{804})/2)/2 \quad (6)$$

$$A_z^{com} = ((A_z^{800} + A_z^{804})/2 - A_x^{802})/2 \quad (7)$$

As with the above, different selective weightings may be used rather than the straight averages indicated in the equations. Moreover, other types of combinations can also be used as alternatives or in addition.

Figure 9:
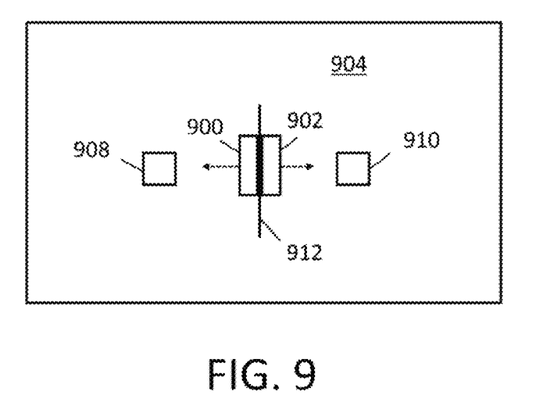
FIGS. 9 and 10 are schematic diagrams of sensor sets having associated thermal elements within a housing according to an embodiment.
Figure 10:
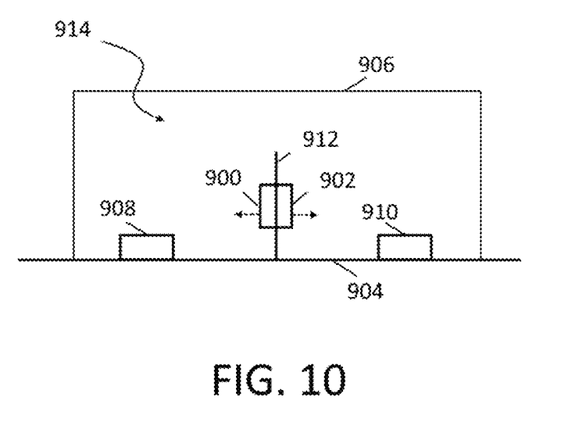

The techniques of this disclosure also include compensating, at least in part, the effects of thermal gradients on a given configuration of sensors by selectively employing thermal elements to reduce the existence of a thermal gradient with respect to the axis of at least one opposing sensor pair. For example, FIG. 9 is a top view and FIG. 10 is a side view that schematically depict one embodiment of a configuration featuring two sets of sensors, sensor sets 900 and 902, mounted to PCB 904 within an enclosure 906. Sensor sets 900 and 902 have an opposing sensor pair with the indicated axes, such that thermal element 908 is associated with the opposing sensor pair sensor of sensor set 900 and thermal element 910 is associated with the opposing sensor pair sensor of sensor set 1002. In this embodiment, thermal elements 908 and 910 have symmetrically opposed positions with respect to their associated sensors. In other embodiments, different numbers of thermal elements may so long as sufficient symmetry exists. Moreover, sensor sets 900 and 902 may be mounted to PCB 904 using a PCB 912 to allow for vertical orientation as desired. Further, a thermally conductive material 914 may be disposed within enclosure 906. Thermally conductive material 914 may be configured to distribute heat more evenly to the sensor surfaces and/or to reduce the latency of heat transfer from the thermal elements to the sensors. As will be appreciated, increasing the thermal conduction from the thermal elements 908 and 910 to sensor sets 900 and 902 helps reduce the existence of thermal gradients within the sensor sets.

Figure 11:
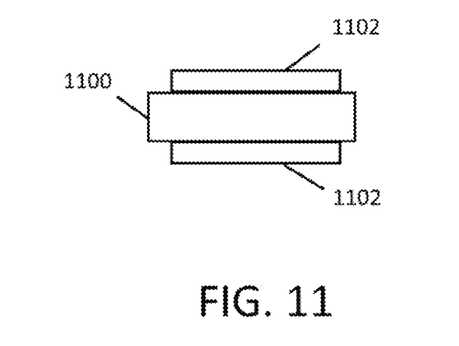
FIG. 11 is schematic diagram of a sensor set having a plurality of thermal elements according to an embodiment.

Yet another embodiment is shown in FIG. 11, in which sensor set 1100 is equipped with a plurality of thermal elements 1102 to help minimize temperature gradients that can affect the sensor. In this context, sensor set 1100 may be implemented as a chip, a package or any other suitable unitary structure, such that thermal elements 1102 may be attached to or otherwise disposed on desired surfaces defining the physical structure of sensor set 1100, such as by positioning thermal elements 1102 on opposing sides of sensor set 1100 as shown. However, any other plurality of thermal elements can be used in any configuration that helps reduce temperature variability within the material from which the sensor is formed resulting from the differential with respect to its environment. Thus, sensor set 1100 may encompass anything from a single sensor having one axis of measurement, to a plurality of sensors of the same type have multiple axes of measurement, as well as having the potential to include any combination of different types of sensors in any different number.

Figure 12:
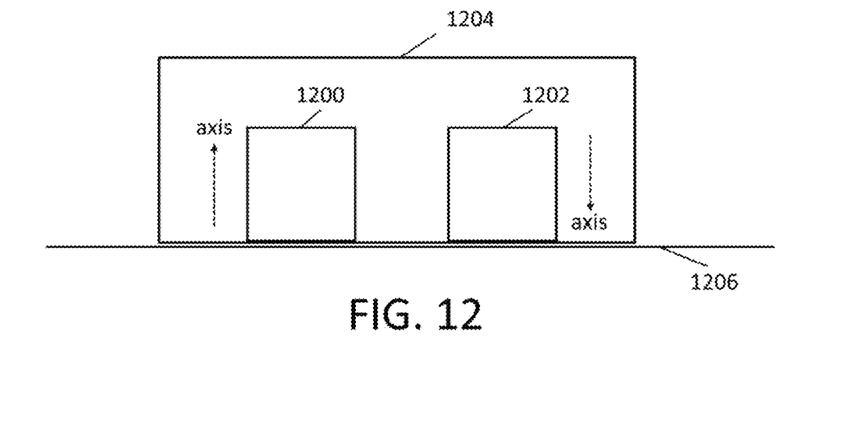
FIG. 12 is schematic diagram of sensor sets having opposing orientations within a package according to an embodiment.
Figure 13:
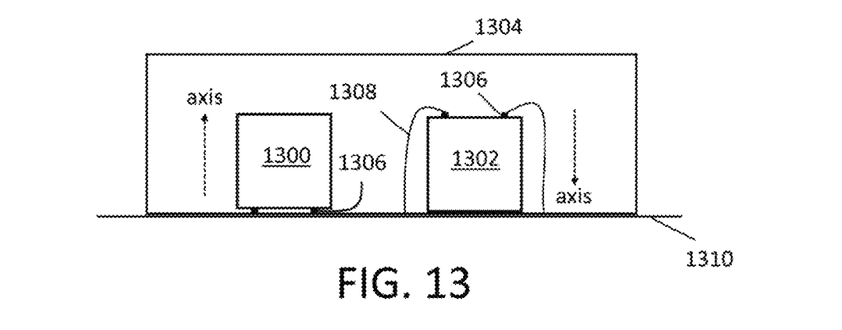
FIG. 13 is schematic diagram of sensor sets in direct mount and inverted mount configurations in a single package according to an embodiment.
Figure 14:
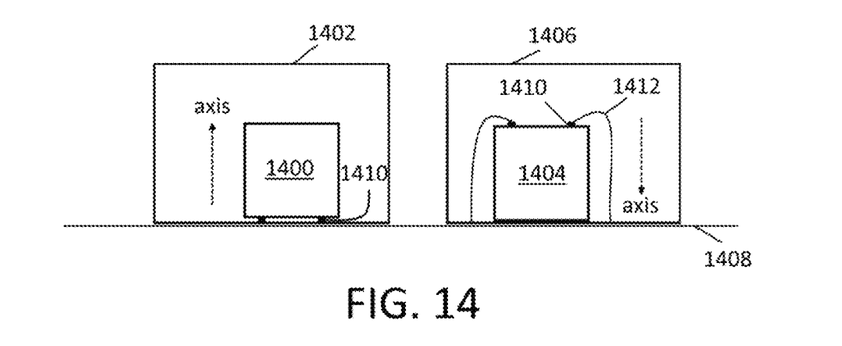
FIG. 14 is schematic diagram of sensor sets in direct mount and inverted mount configurations in separate packages according to an embodiment.

From the above discussion, it will be appreciated that benefits of compensating for temperature gradients may be obtained by providing at least one opposing sensor pair. One technique for achieving such configurations is to implement at least one sensor of an opposing sensor pair in a package, such that the other sensor of the opposing sensor pair is mounted in an opposing orientation with respect to the package. As noted above, the function of a package is to facilitate connection between the sensor set and a substrate or support, such as e.g. a PCB. Thus, a package can be a single chip or multiple chips within a single package. In one embodiment, the sensor sets having the opposing sensor pair are contained within a single package as schematically depicted in FIG. 12. In particular, sensor set 1200 has at least one sensor with the indicated axis of measurement and sensor set 1202 has at least one sensor of the same type with its axis of measurement in the opposing orientation. Both sensor sets 1200 and 1202 are contained within package 1204 and may be separate chips or may be separate sensor dies as desired. As another exemplary embodiment, FIG. 13 schematically depicts sensor set 1300 with a direct mount and sensor set 1302 with an inverted mount within package 1304. For example, sensor set 1300 may be mounted by a direct mount such as by directly soldering pins 1306 while sensor set 1302 has an inverted mount in which wire jumpers 1308 provide the electrical connection with pins 1306. Package 1304 may then be mounted to PCB 1310. As will be appreciated, the embodiment of FIG. 13 allows for sensor sets 1300 and 1302 to have identical configurations, such that their configuration allows them to be mounted with a direct mount or an inverse mount (may also be referred to as flip-chip). This avoids the need to manufacture different parts, facilitating fabrication and/or stocking. Alternatively, as shown in FIG. 14, sensor set 1400 has at least one sensor with the indicated axis of measurement and is implemented within one package, package 1402. In turn, sensor set 1404 has at least one sensor of the same type with its axis of measurement, implemented within another package, package 1406. Both packages 1402 and 1406 may then be mounted to PCB 1408, with the sensor sets mounted such that the axes of measurement are in opposing orientations. For example, sensor set 1400 may be mounted by a direct mount within package 1402 such as by directly soldering pins 1410 to PCB 1408. Correspondingly, sensor set 1404 has an inverted mount in which wire jumpers 1412 provide the electrical connection between pins 1410 and package 1404. As will be appreciated, the embodiment of FIG. 14 allows for packages 1402 and 1406 to be mounted in the same way while forming one or more opposing sensor pairs between them.

Figure 15:
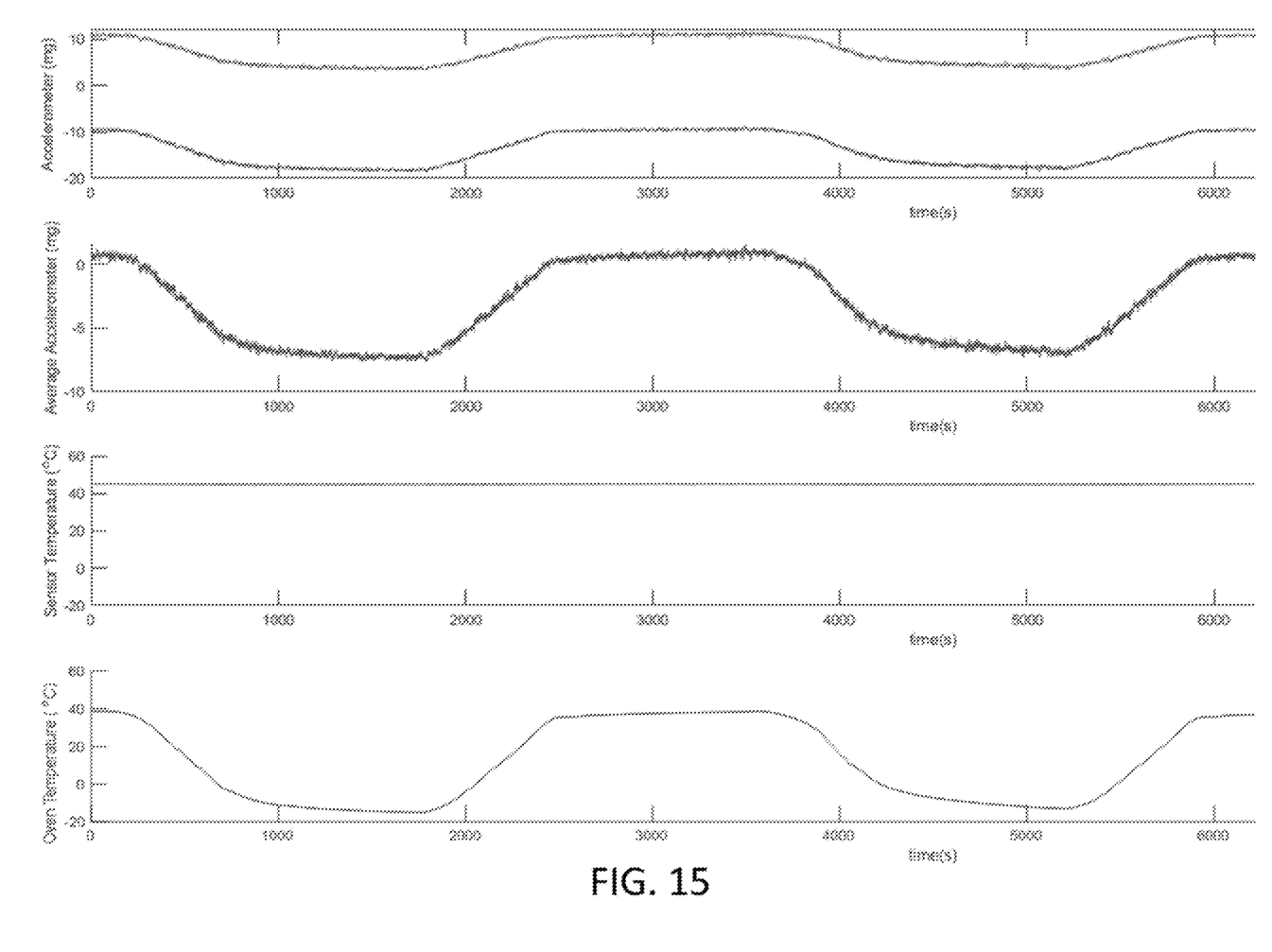
FIG. 15 is schematic diagram showing the effects of temperature differentials on sensor measurements.

To help illustrate a further aspect of this disclosure, FIG. 15 is a schematic representation of the sensor readings for an opposing sensor pair of accelerometers maintained at a controlled temperature, while the environment of an oven undergoes changing temperature. Notably, the bottom graph depicts the changing oven temperature and the second from bottom graph show the temperature measured at the opposing sensor pair. As indicated, the sensor temperature is held constant, resulting in a differential between the sensor temperature and the environment temperature that changes significantly over time. This differential causes a temperature gradient to be induced within the sensors even though temperature controlled. Correspondingly, the two traces of the top graph represent measurements output by each sensor of the opposing sensor pair in the combined output coordinate frame, with their combined measurement indicated in the second from top graph. Although the use of opposing sensors significantly mitigates the effects of the temperature gradient, there remains a residual effect that degrades accuracy as shown.

Given that residual temperature gradient effects may remain due to the above or for other reasons, the sensor configurations of this disclosure employing thermal elements to reduce the temperature gradients may help mitigate these effects. Moreover, a further aspect of this disclosure relates to performing a factory calibration with respect to the sensor sets discussed above after the sensor sets are positioned with respect to each other to form the opposing sensor pairs. As desired, the factory calibration may be designed to mitigate for an initial shock of temperature regulation. Alternatively, or in addition, the factory calibration may be designed to mitigate for a thermal effect resulting from an environmental temperature differential. Moreover, the factory calibration may be designed to mitigate for a stabilization period. The calibration may include assessing the inputs required to keep the sensor set at a desired temperature relative to its environment. As desired, the calibration may be configured to compensate for changes in sensor temperature as well changes in environmental temperature, as both may influence the temperature gradient.

According to the techniques described above, a method for configuring sensors sets to compensate for a temperature gradient is provided. The method may include providing a first sensor set, having at least two sensors of a same type that have axes orthogonal with respect to each other and providing a second sensor set, having at least two sensors of the same type that have axes orthogonal with respect to each other. The first and second sensor sets may then be positioned with respect to each other to form at least one opposing sensor pair, in which an axis of one sensor of one sensor set is in an opposite orientation to an axis of one sensor of another sensor set. Correspondingly, a combined measurement of each opposing sensor pair may be output, wherein each combined measurement is compensated for an effect of a temperature gradient on sensor measurements of the sensors.

In one aspect, outputting each combined measurement may involve averaging a sum of a sensor measurement of one sensor of an opposing sensor pair and an inverted sensor measurement of another sensor of the opposing sensor pair.

In one aspect, outputting each combined measurement may involve selectively weighting a sensor measurement of one sensor of an opposing sensor pair and an inverted sensor measurement of another sensor of the opposing sensor pair, wherein the selective weighting is based at least in part, on a calibration procedure.

In one aspect, the first and second sensor sets may be positioned with respect to each other to form two opposing sensor pairs.

In one aspect, the method may also involve providing a third sensor set, having three sensors of a same type that have axes orthogonal with respect to each other, wherein the first and second sensor sets have three sensors of the same type that have axes orthogonal with respect to each other so that the first, second and third sensor sets may be positioned with respect to each other to form three opposing sensor pairs. Accordingly, outputting each combined measurement comprises averaging a sum of a sensor measurement of one sensor of an opposing sensor pair and an inverted sensor measurement of another sensor of the opposing sensor pair. Alternatively or in addition, outputting each combined measurement comprises averaging a sum of an inverted sensor measurement of one sensor of an opposing sensor pair and an average of a sensor measurement of another sensor of the opposing sensor pair and a sensor measurement from a sensor of another of the sensor sets having a coinciding orientation.

In one aspect, the at least one opposing sensor pair may be aligned with a temperature gradient caused by at least one thermal element. The first and second sensor sets may be positioned with respect to the at least one thermal element to generate opposing temperature gradients in the aligned opposing sensor pair. As such, positioning the first and second sensor sets with respect to the at least one thermal element may include locating each sensor of the aligned opposing sensor pair symmetrically with respect to the at least one thermal element.

In one aspect, a first thermal element associated with one sensor of the at least one opposing sensor pair may be provided and a second thermal element associated with another sensor of the at least one opposing sensor pair may be provided. The first thermal element and the second thermal element may have symmetrically opposed positions with respect to each of the sensors of the at least one opposing sensor pairs. The first and second thermal elements may be coupled with the at least one opposing sensor pair using thermally conductive material.

In one aspect, a plurality of thermal elements may be provided on surfaces of at least one of the sensor sets to reduce a thermal gradient with respect to at least one of the sensors.

In one aspect, the first sensor set may be contained in a package and the at least one opposing sensor pair may be formed by mounting the second sensor set in an opposing orientation with respect to the package. As desired, both sensor sets may be contained within the package. Alternatively, each sensor set may be contained within a separate package and the first sensor set may be mounted using a direct mount and the second sensor set may be mounted using an inverted mount. As such, each of the sensor assemblies have an identical configuration that allows direct and inverted mounting.

As noted above, the techniques of this disclosure also involve a sensor configuration to compensate for a temperature gradient featuring a first sensor set, having at least two sensors of a same type that have axes orthogonal with respect to each other and a second sensor set, having at least two sensors of the same type that have axes orthogonal with respect to each other. The first and second sensor sets may be positioned with respect to each other to form at least one opposing sensor pair, in which an axis of one sensor of one sensor set is in an opposite orientation to an axis of one sensor of another sensor set and wherein the sensor configuration is operable to output a combined measurement of each opposing sensor pair, wherein each combined measurement is compensated for an effect of a temperature gradient on sensor measurements of the sensors.

In one aspect, a third sensor set, having three sensors of a same type that have axes orthogonal with respect to each other, wherein the first and second sensor sets have three sensors of the same type that have axes orthogonal with respect to each other, may also be used such that the first, second and third sensor sets are positioned with respect to each other to form three opposing sensor pairs.

In one aspect, a first thermal element may be associated with one sensor of the at least one opposing sensor pair and a second thermal element may be associated with another sensor of the at least one opposing sensor pair.

In one aspect, a plurality of thermal elements on surfaces of at least one of the sensor sets configured to reduce a thermal gradient with respect to at least one of the sensors.

In one aspect, the first sensor set may be contained in a package and the second sensor set may be mounted in an opposing orientation with respect to the package to form the at least one opposing sensor pair. Each sensor set may be contained within a separate package and the first sensor set may be mounted using a direct mount and the second sensor set may be mounted using an inverted mount.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the present invention.

What is claimed is:

1. A method for configuring sensor sets to compensate for a temperature gradient, comprising:
   providing a first sensor set, having at least two sensors of a same type that have axes orthogonal with respect to each other;
   providing a second sensor set, having at least two sensors of the same type that have axes orthogonal with respect to each other;
   positioning the first and second sensor sets with respect to each other to form at least one opposing sensor pair, in which an axis of one sensor of one sensor set is in an opposite orientation to an axis of one sensor of another sensor set;
   outputting a combined measurement of each opposing sensor pair, wherein each combined measurement is compensated for an effect of a temperature gradient on sensor measurements of the sensors.

2. The method of claim 1, wherein outputting each combined measurement comprises averaging a sum of a sensor measurement of one sensor of an opposing sensor pair and an inverted sensor measurement of another sensor of the opposing sensor pair.

3. The method of claim 1, wherein outputting each combined measurement comprises selectively weighting a sensor measurement of one sensor of an opposing sensor pair and an inverted sensor measurement of another sensor of the opposing sensor pair, wherein the selective weighting is based at least in part, on a calibration procedure.

4. The method of claim 1, wherein the first and second sensor sets are positioned with respect to each other to form two opposing sensor pairs.

5. The method of claim 1, further comprising:
   providing a third sensor set, having three sensors of a same type that have axes orthogonal with respect to each other, wherein the first and second sensor sets have three sensors of the same type that have axes orthogonal with respect to each other; and
   positioning the first, second and third sensor sets with respect to each other to form three opposing sensor pairs.

6. The method of claim 5, wherein outputting each combined measurement comprises averaging a sum of a sensor measurement of one sensor of an opposing sensor pair and an inverted sensor measurement of another sensor of the opposing sensor pair.

7. The method of claim 5, wherein outputting each combined measurement comprises averaging a sum of an inverted sensor measurement of one sensor of an opposing sensor pair and an average of a sensor measurement of another sensor of the opposing sensor pair and a sensor measurement from a sensor of another of the sensor sets having a coinciding orientation.

8. The method of claim 1, wherein the at least one opposing sensor pair is aligned with a temperature gradient caused by at least one thermal element.

9. The method of claim 8, comprising positioning the first and second sensor sets with respect to the at least one thermal element to generate opposing temperature gradients in the aligned opposing sensor pair.

10. The method of claim 8, wherein positioning the first and second sensor sets with respect to the at least one thermal element comprises locating each sensor of the aligned opposing sensor pair symmetrically with respect to the at least one thermal element.

11. The method of claim 1, further comprising providing a first thermal element associated with one sensor of the at least one opposing sensor pair and a second thermal element associated with another sensor of the at least one opposing sensor pair.

12. The method of claim 11, wherein the first thermal element and the second thermal element have symmetrically opposed positions with respect to each of the sensors of the at least one opposing sensor pairs.

13. The method of claim 11, further comprising coupling the first and second thermal elements with the at least one opposing sensor pairs with thermally conductive material.

14. The method of claim 1, further comprising providing a plurality of thermal elements on surfaces of at least one of the sensor sets to reduce a thermal gradient with respect to at least one of the sensors.

15. The method of claim 1, wherein the first sensor set is contained in a package and the at least one opposing sensor pair is formed by mounting the second sensor set in an opposing orientation with respect to the package.

16. The method of claim 15, wherein both sensor sets are contained within the package.

17. The method of claim 15, wherein each sensor set is contained within a separate package and the first sensor set is mounted using a direct mount and the second sensor set is mounted using an inverted mount.

18. The method of claim 17, wherein each of the sensor assemblies have an identical configuration that allows direct and inverted mounting.

19. A sensor configuration to compensate for a temperature gradient, comprising:
a first sensor set, having at least two sensors of a same type that have axes orthogonal with respect to each other; and
a second sensor set, having at least two sensors of the same type that have axes orthogonal with respect to each other,
wherein the first and second sensor sets are positioned with respect to each other to form at least one opposing sensor pair, in which an axis of one sensor of one sensor set is in an opposite orientation to an axis of one sensor of another sensor set and wherein the sensor configuration is operable to output a combined measurement of each opposing sensor pair, wherein each combined measurement is compensated for an effect of a temperature gradient on sensor measurements of the sensors.

20. The sensor configuration of claim 19, further comprising a third sensor set, having three sensors of a same type that have axes orthogonal with respect to each other, wherein the first and second sensor sets have three sensors of the same type that have axes orthogonal with respect to each other, wherein the first, second and third sensor sets are positioned with respect to each other to form three opposing sensor pairs.

21. The sensor configuration of claim 19, further comprising a first thermal element associated with one sensor of the at least one opposing sensor pair and a second thermal element associated with another sensor of the at least one opposing sensor pair.

22. The sensor configuration of claim 19, further comprising a plurality of thermal elements on surfaces of at least one of the sensor sets configured to reduce a thermal gradient with respect to at least one of the sensors.

23. The sensor configuration of claim 19, wherein the first sensor set is contained in a package and the second sensor set is mounted in an opposing orientation with respect to the package to form the at least one opposing sensor pair.

24. The sensor configuration of claim 23, wherein each sensor set is contained within a separate package and the first sensor set is mounted using a direct mount and the second sensor set is mounted using an inverted mount.

25. A sensor set to compensate for a temperature gradient, comprising a first sensor set, having at least one sensor having an axis, and a packaging that allows direct and inverted mounting, wherein mounting one sensor set with direct mounting and one sensor set with inverted mounting forms at least one opposing sensor pair, in which the axis of the at least one sensor of one sensor set is in an opposite orientation to the axis of the at least one sensor of the other sensor set so that measurements from both sensor sets are combinable to compensate for an effect of a temperature gradient on sensor measurements of the sensors.

* * * * *